United States Patent
Lei et al.

(10) Patent No.: US 10,492,343 B2
(45) Date of Patent: Nov. 26, 2019

(54) VEHICLE POWER MODULE ASSEMBLY WITH COOLING

(71) Applicant: Ford Global Technologies, LLC, Dearborn, MI (US)

(72) Inventors: Guangyin Lei, Dearborn Heights, MI (US); Michael W. Degner, Novi, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/244,410

(22) Filed: Aug. 23, 2016

(65) Prior Publication Data

US 2018/0063989 A1 Mar. 1, 2018

(51) Int. Cl.
*H05K 7/20* (2006.01)
*H01L 21/48* (2006.01)
*H01L 23/367* (2006.01)
*H01L 23/467* (2006.01)
*H01L 23/473* (2006.01)
*H01L 25/07* (2006.01)

(52) U.S. Cl.
CPC ....... *H05K 7/2089* (2013.01); *H01L 21/4882* (2013.01); *H01L 23/3675* (2013.01);
(Continued)

(58) Field of Classification Search
CPC ............. H01L 21/4882; H01L 23/3675; H01L 23/467; H01L 2924/00; H01L 2924/0002; H01L 23/473; H01L 2924/13055; H01L 2924/1305; H01L 23/3735; H01L 2224/24137; H01L 23/4012; H01L 23/5385; H01L 25/117; H05K 7/2089; H05K 7/20327; H05K 7/20254; H05K 7/20272; F28F 2250/104; F28F 13/12; F28F 7/00; F28F 3/12; F28F 9/26; F28F 13/02; F28F 3/048; F28F 2260/02; F28F 13/06; F28F 2013/006; F28D 15/00; F28D 2021/0029; F28D 15/0266; F28D 1/0475;
(Continued)

(56) References Cited

U.S. PATENT DOCUMENTS 6,970,485 B1 11/2005 Kitayama et al.
7,231,960 B2 6/2007 Sakai
(Continued)

FOREIGN PATENT DOCUMENTS

JP 2012015288 A 1/2012

*Primary Examiner* — Mandeep S Buttar
(74) *Attorney, Agent, or Firm* — David B. Kelley; Brooks Kushman P.C.

(57) ABSTRACT

A vehicle power system may include a power module assembly having a plurality of alternating heatsinks and phase legs arranged in a deck. Each of the phase legs includes a semiconductor switch in contact with a dielectric layer. The dielectric layer is sandwiched between the switch and one of the heatsinks such that heat generated by the switch is transferred to the heatsink via the dielectric. At least one of the heatsinks may define a coolant channel. The coolant channel may be U-shaped. The coolant channel may have inlet and outlet regions. The inlet region may be opposite the outlet region. The coolant channel may have a divider to segregate ingress and egress coolant paths. The coolant channel may have obstructions to form a tortuous path. The obstructions may be wavy fins.

5 Claims, 5 Drawing Sheets

(52) U.S. Cl.
CPC .......... *H01L 23/467* (2013.01); *H01L 23/473* (2013.01); *H01L 25/07* (2013.01); *H05K 7/20127* (2013.01); *H05K 7/20272* (2013.01); *H05K 7/20409* (2013.01); *H05K 7/20927* (2013.01)

(58) Field of Classification Search
CPC .... F28D 1/0471; F28D 1/05366; F28D 1/035; F28D 2021/0028; H01M 10/613
USPC ......................................................... 361/702
See application file for complete search history.

(56) References Cited

U.S. PATENT DOCUMENTS

| | | | |
|---|---|---|---|
| 7,353,859 B2* | 4/2008 | Stevanovic | H01L 23/473 165/170 |
| 7,835,151 B2* | 11/2010 | Olesen | H01L 23/473 165/121 |
| 2002/0101718 A1* | 8/2002 | Negishi | F28F 3/025 361/699 |
| 2002/0134419 A1* | 9/2002 | Macris | H01L 23/38 136/204 |
| 2005/0259402 A1* | 11/2005 | Yasui | H02M 7/003 361/716 |
| 2008/0239663 A1* | 10/2008 | Yamamoto | H01L 23/473 361/691 |
| 2015/0194286 A1* | 7/2015 | Karlstedt | H05G 1/025 378/62 |
| 2017/0098875 A1* | 4/2017 | Kim | H01M 10/66 |
| 2018/0261526 A1* | 9/2018 | Machler | F28F 3/12 |

* cited by examiner

VEHICLE POWER MODULE ASSEMBLY WITH COOLING

TECHNICAL FIELD

This disclosure relates to power module cooling and design.

BACKGROUND

Vehicles may include electric machines for electricity generation and propulsion. Generation and propulsion require a combination of switches and controllers to properly control electric current. The switches may be stacked to form a power module assembly. Capabilities of the power module assembly may be limited by cooling capability for the switches.

SUMMARY

A vehicle power system may include a power module assembly having a plurality of alternating heatsinks and phase legs arranged in a deck, each of the phase legs including a semiconductor switch disposed in contact with a dielectric layer, the dielectric layer being sandwiched between the switch and one of the heatsinks such that heat generated by the switch is transferred to the heatsink via the dielectric. At least one of the heatsinks may define a coolant channel. The coolant channel may be U-shaped. The coolant channel may have inlet and outlet regions. The inlet region may be opposite the outlet region. The coolant channel may have a divider to segregate ingress and egress coolant paths. The coolant channel may have obstructions to form a tortuous path. The obstructions may be wavy fins.

A method for constructing a power module assembly may include alternately stacking a plurality of dielectric-phase leg-dielectric triplets and heatsinks such that each of the heatsinks is sandwiched between a pair of the triplets. The method may include collectively curing the plurality to fuse the triplets and heatsinks to form the power module assembly. The heatsinks may define coolant channels. The method may include attaching a coolant manifold to the coolant channels. The coolant manifold may include ingress and egress paths.

DETAILED DESCRIPTION

Figure 1:
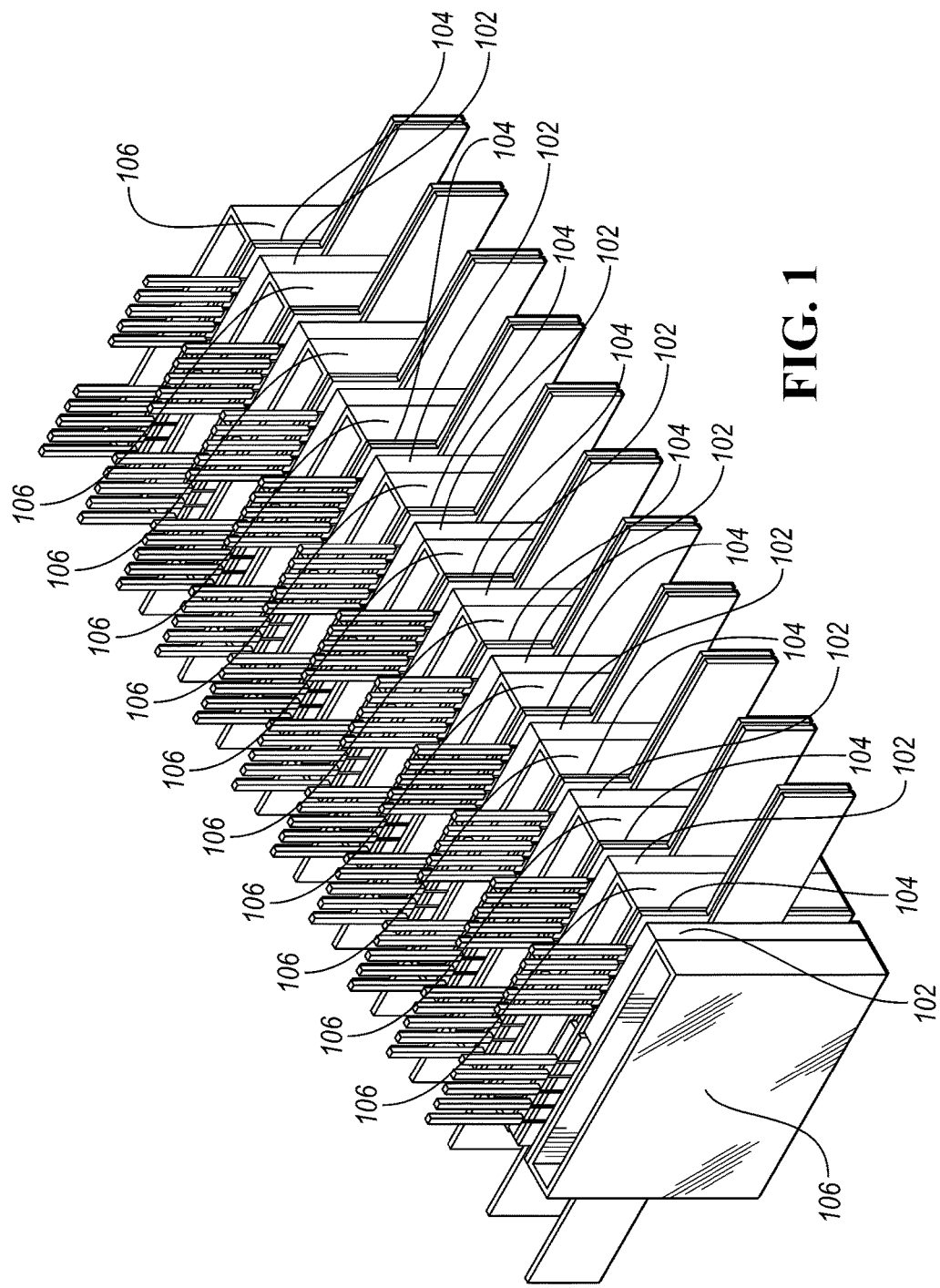
FIG. 1 is a perspective view of a power module assembly.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Vehicles may include electric machines for electricity generation and propulsion. Generation and propulsion require a combination of switches and controllers to properly control current flow to the electric machines. The switches may be stacked to form a unitary power module assembly. Each power module may include a phase leg of an H-bridge. The power module may be configured to provide redundant switches for increased current load or additional phase legs for a full-H or half-H bridge. The switches typically release resistive losses in the form of heat. The heat may accumulate in the assembly, limiting the throughput of the power modules.

Heatsinks may be added to the assembly to dissipate heat generated during use. Heatsinks may be attached to the power modules to draw heat from the modules. In order to improve heat transfer, materials having high thermal conductivity may be used. For example, metals and metal alloys have high thermal conductivity. Materials having high thermal conductivity, unfortunately, typically have high electrical conductivity. High electrical conductivity can be detrimental to power module assemblies, which pass high currents and voltages. In order to prevent short circuits between power modules and heatsinks, a dielectric material may be placed between the heatsink and the power module. The dielectric material may be selected with a high thermal conductivity and low electrical conductivity. For example, diamond may be embedded in the dielectric layer to electrically insulate and thermally conduct.

The use of dielectrics can require assembly of the power module to require curing. Other power module assembly designs may require the curing of the dielectric to be done for each phase leg of the assembly. Design tolerances may require expensive manufacturing of the power module assemblies because slight variations in assembly position may lead to large deviations in the aggregate. For example, a manufacturing process's precision may meet design tolerances for assemblies having a few phase legs but unacceptable for numerous phase legs. To meet engineering tolerances, the assembly may be collectively cured. Collective curing reduces variation in the manufacturing process and was previously unavailable because of cooling requirements and design constraints. As disclosed, the power assembly may provide adequate cooling and allow cost effective assembly, while meeting design constraints.

The assembly may be surrounded by an epoxy and sealed in a chassis. The chassis may include a coolant manifold. The coolant manifold may have an inlet and outlet located on the same side of the chassis. In another embodiment, the coolant manifold may have an inlet on one side of the chassis and the outlet on another side of the chassis. The manifold may distribute coolant to each coolant channel to ensure adequate cooling of the switches.

The power module assembly may include a plurality of semiconducting switches. The switches may be situated within a pair of dielectric layers to form a dielectric-phase leg-dielectric (DPD) triplet. The DPD triplet is combined with heatsinks on either side to remove heat from the switch of the phase leg during use. The plurality of DPD triplets and heatsinks may form a deck. The deck may be formed by DPD triplets and heatsinks stacked front to back.

The heatsink may remove heat from the semiconducting switch through convection or conduction. The heatsink may operate based on convection or conduction. The heatsink may define coolant channels for conductive heat transfer. The coolant channels may be configured in a variety of ways. The coolant channels may serve as a through-ways, allowing ingress of fluid from one end and egress of fluid at the other. The ingress and egress regions of the coolant channel may be situated at any point on the coolant channel. For example, the fluid may enter the channel from the bottom of the channel and exit at a 90° angle from the bottom. In another example, the fluid may also enter and exit the coolant channel from the same direction. The coolant channel is configured to allow ingress and egress of coolant to ensure heat is removed from the electronics.

The coolant channels may have features designed to control fluid or coolant flow. The features may have a variety of implementations to direct or agitate flow. In one embodiment the coolant channel may have a U-shape to position the ingress and egress locations on the same end. In another embodiment the inlet and outlet regions may be opposite. The coolant channel may include a divider to segregate fresh coolant from consumed coolant. For example, the divider may be sized to match the flow rate of the coolant. The coolant or fluid is then enabled to traverse the entire channel before being expelled in a similar direction.

Figure 2:
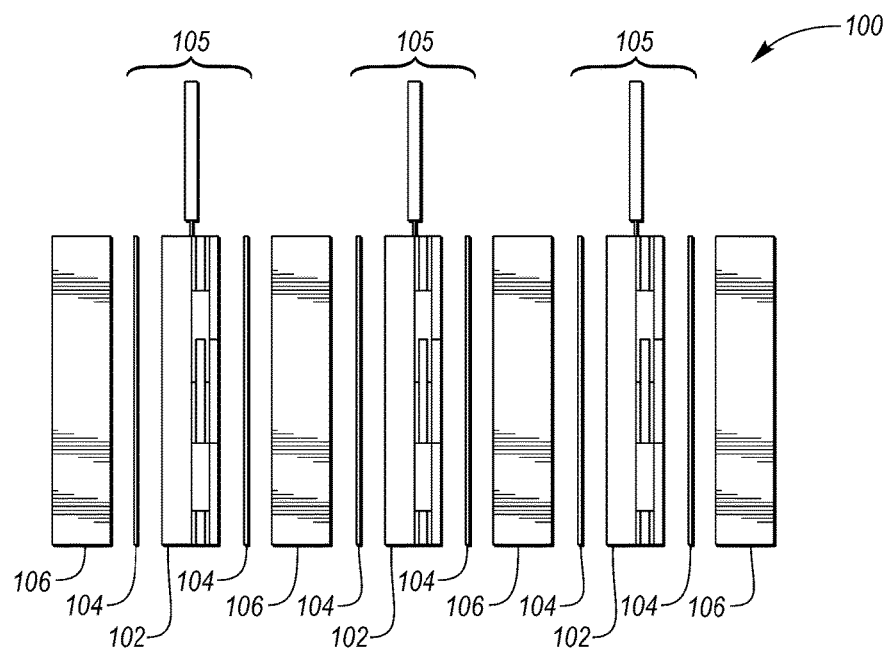
FIG. 2 is a side view of a power module assembly including a heatsink, a dielectric layer, and a switch.
Figure 3:
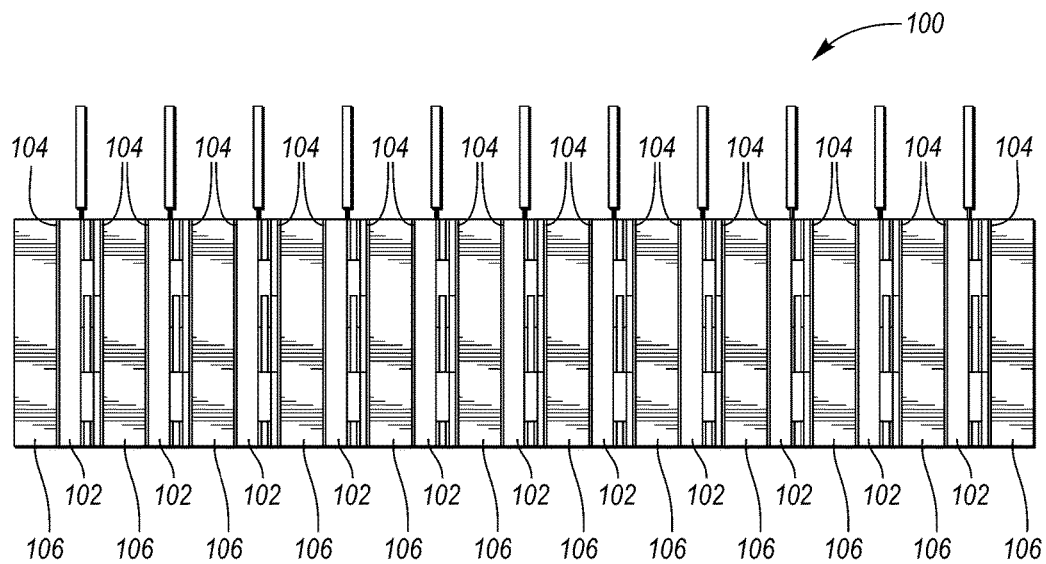
FIG. 3 is a side view of a power module assembly including a heatsink, a dielectric layer, and a switch.

Now referring to FIGS. 1-3, a power module assembly 100 is shown. The power module assembly has a plurality of phase legs or semiconducting switches 102. The semiconducting switches are sandwiched between a plurality of heatsinks 106. Although shown with each semiconducting switch 102 sandwiched between the heatsinks 106, fewer heatsinks 106 may be used. A dielectric layer 104 may separate the semiconducting switches 102 from the heatsinks 106. The size of each element may vary to balance heat removal and assembly size. As shown, the assembly may have a few phase legs or numerous phase legs depending on the intended use of the assembly.

Figure 4C:
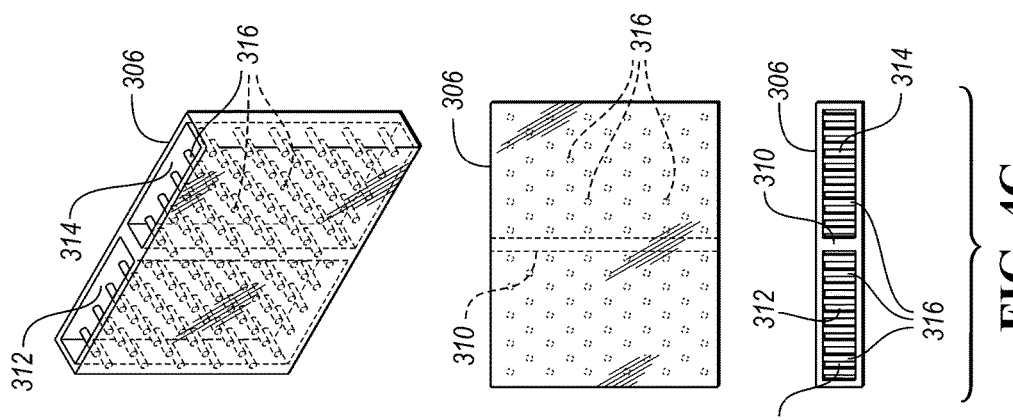
FIG. 4C depicts a through cavity heatsink having a central divider and directional fins or guides.
Figure 4B:
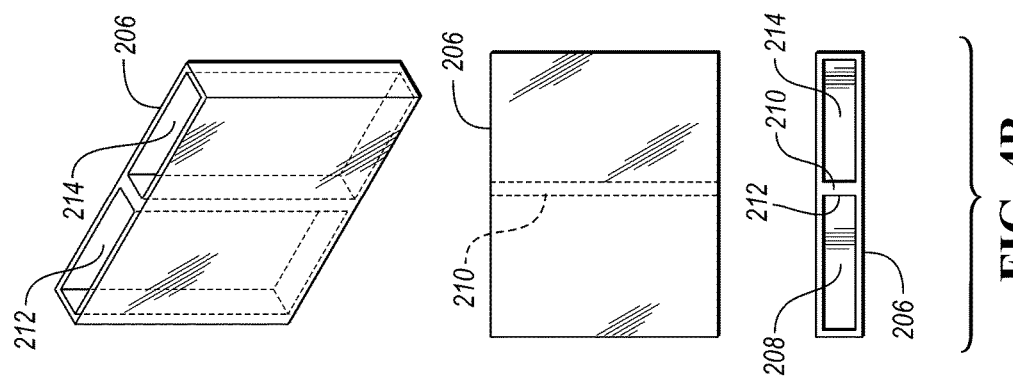
FIG. 4B depicts a through cavity heatsink having a center divider.
Figure 4A:
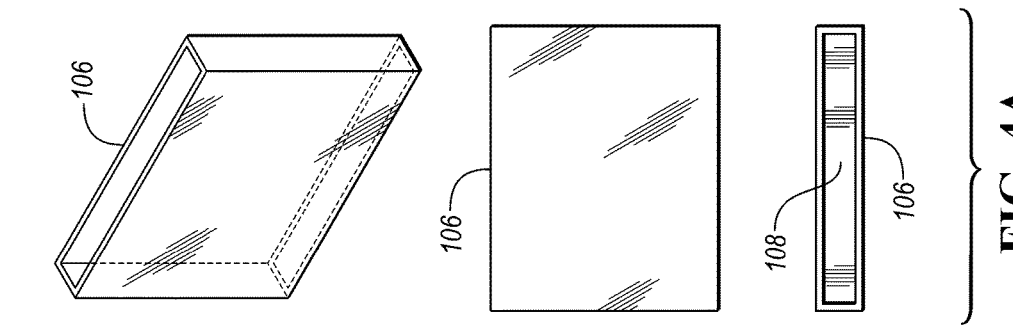
FIG. 4A depicts a through cavity heatsink with minimal fluid control features.

Now referring to FIGS. 4A-C, the heatsink 106 may have different configurations to improve heat transfer. Heatsink 106 is a through channel cavity having a coolant channel 108 defined throughout the heatsink 106. An assembly manifold (not shown) may have an inlet on one side of the heatsink 106 and an outlet on the opposite side of the heatsink 106. Heatsink 206 is a through channel cavity having a coolant channel 208 defined throughout the heatsink 206. Heatsink 206 may include a divider 210 to separate the coolant or fluid. In some embodiments the coolant may be directed to an opposite or adjacent side for recirculation. The divider 210 may separate individual flow paths 212, 214 to limit hot spots. Heatsink 306 is a through channel cavity having a coolant channel 308 defined throughout the heatsink 306. Heatsink 306 may include a divider 310 to separate the coolant or fluid. The divider 310 may separate individual flow paths 312, 314 to limit hot spots. The heatsink 306 may include a plurality of fins or guides 316. The fins 316 are configured to agitate the coolant flow to reduce isolated warming of the coolant fluid. Any type of obstruction may be used to create a tortuous path and agitate coolant. As a non-limited example, pins, fins, blocks, guides, baffles, or curves may be used.

Figure 5C:
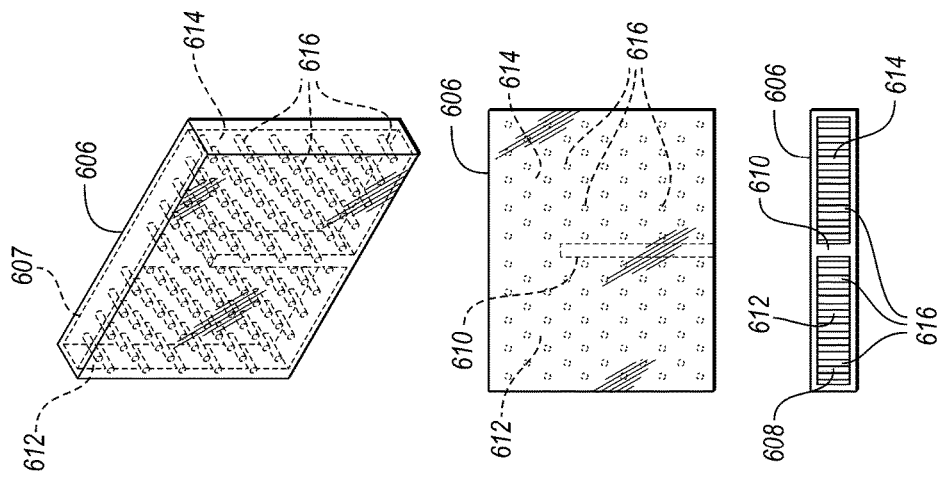
FIG. 5C depicts a closed cavity heatsink having a U-shaped coolant channel with a closed top and directional fins.
Figure 5B:
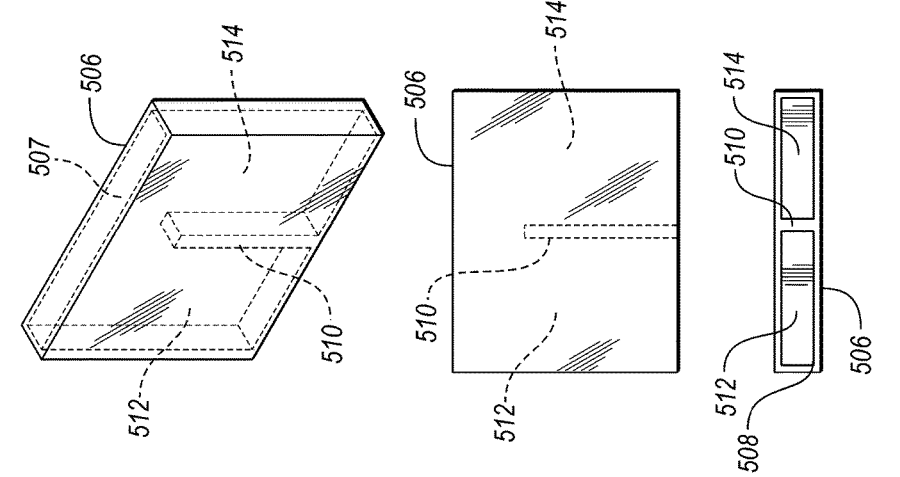
FIG. 5B depicts a closed cavity heatsink having a U-shaped coolant channel and a closed top.
Figure 5A:
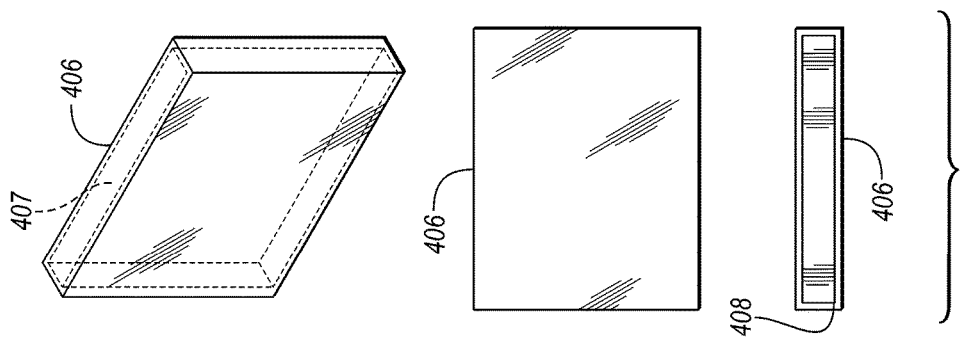
FIG. 5A depicts a closed cavity heatsink having a coolant channel and a closed top.

Now referring to FIGS. 5A-C, the U-shaped heatsink 406 may have different configurations to improve heat transfer. Heatsink 406 includes a U-shaped coolant channel 408 defined throughout the heatsink 406. The U-shaped heatsink 406 may have an inlet or ingress on one side of the heatsink 406 and an outlet or egress on the same side of the heatsink 406. The heatsink 406 may include a cover 407 to block one end of the coolant channel 408. Heatsink 506 is a U-shaped coolant channel 508 defined throughout the heatsink 506. Heatsink 506 may include a divider 510 to separate the coolant or fluid and form the U-shaped channel 508. The U-shaped heatsink 506 may have an inlet or ingress 512 on one side of the heatsink 506 and an outlet or egress 514 on the same side of the heatsink 506. The divider 510 may separate individual flow paths 512, 514 to limit hot spots. The heatsink 506 may include a cover 507 to block one end of the coolant channel 508. Heatsink 606 is a U-shaped coolant channel 608 defined throughout the heatsink 606. Heatsink 606 may include a divider 610 to separate the coolant or fluid and form the U-shaped channel 608. The U-shaped heatsink 606 may have an inlet or ingress 612 on one side of the heatsink 606 and an outlet or egress 614 on the same side of the heatsink 606. The divider 610 may separate individual flow paths 612, 614 to limit hot spots. The heatsink 606 may include a cover 607 to block one end of the coolant channel 608. The heatsink 606 may include a plurality of fins or guides 616. The fins 616 are configured to agitate the coolant flow to reduce isolated warming of the coolant fluid.

Figure 6A:
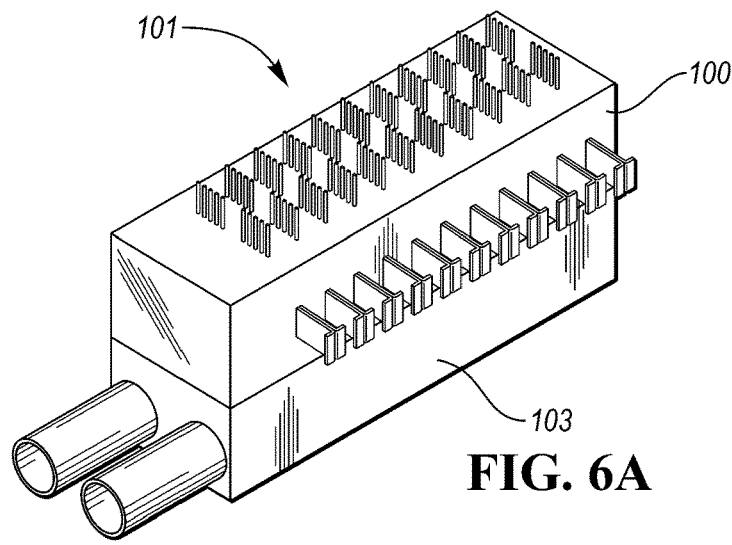
FIG. 6A depicts a power module assembly chassis housing a power module assembly.
Figure 6B:
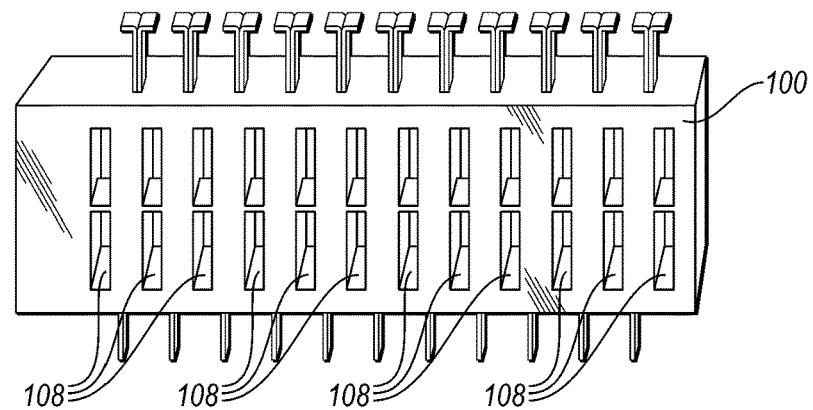
FIG. 6B depicts a power module assembly encased in an epoxy or resin to secure the phase legs of the power module assemblies.
Figure 6C:
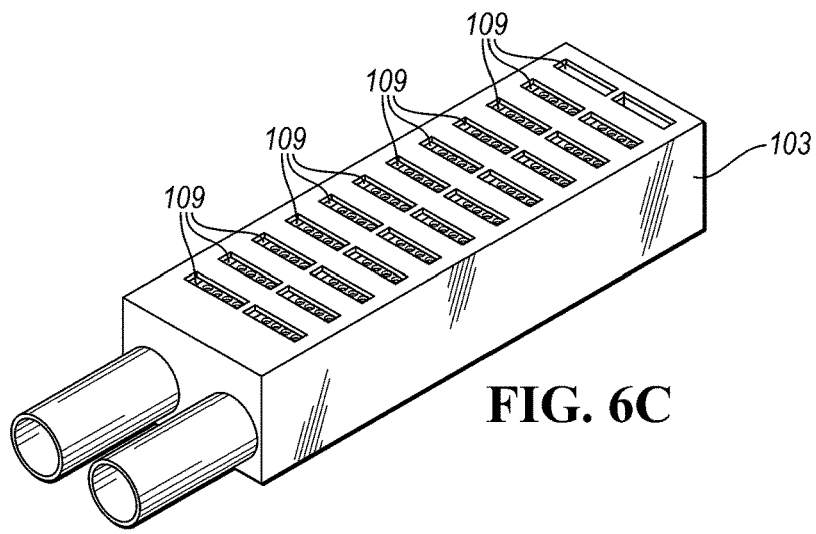
FIG. 6C depicts a power module assembly coolant manifold adapted to mate with the power module assembly to provide coolant to the coolant channels.

Now referring to FIGS. 6A-C, a chassis 101 for a manifold is shown. The chassis may be an epoxy coating or retention material. The chassis 101 may include a power module assembly 100 having a plurality of coolant channels 108. The coolant channels 108 may be formed from heatsinks within the assembly 100. The chassis 101 may also include a coolant manifold 103 configured to supply the coolant channels 108 with coolant. The coolant manifold 103 may include a plurality of ports 109 to direct the flow of coolant. In another embodiment, the coolant manifold 103 may have a plurality of ports 109 on multiple sides of the assembly 100 to ensure proper cooling of the switches.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle power system comprising: a power module assembly including a plurality of dielectric-phase leg-dielectric triplets alternated with a plurality of heatsinks such that major faces of each of the heatsinks are sandwiched between and in direct contact with a pair of the triplets, wherein each of the heatsinks includes an internal divider having major faces perpendicular to the major faces of each of the heatsinks projecting into an interior thereof to form a U-shaped channel in fluid communication with a manifold such that fluid entering the U-shaped channel directly receives heat at a same time from the pair of the triplets on opposite sides of the heatsink and fluid exiting the U-shaped channel directly receives heat at a same time from the pair of the triplets on opposite sides of the heatsink, and wherein the channels are not between corresponding inlets and outlets of the manifold.

2. The power module assembly of claim 1, wherein each of the heatsinks defines a coolant channel.

3. The power module assembly of claim 2, wherein the coolant channel has inlet and outlet regions.

4. The power module assembly of claim 3, wherein the inlet region is opposite the outlet region.

5. The power module assembly of claim 2, wherein the coolant channel has obstructions to form a tortuous path.

\* \* \* \* \*